(12) United States Patent
Satterfield et al.

(10) Patent No.: US 6,524,869 B1
(45) Date of Patent: Feb. 25, 2003

(54) METHOD AND APPARATUS FOR DETECTING ION IMPLANT INDUCED DEFECTS

(75) Inventors: Michael J. Satterfield, Round Rock, TX (US); Laura A. Pressley, Austin, TX (US); Terri A. Couteau, Rosansky, TX (US); Daniel E. Sutton, Austin, TX (US); Bryon K. Hance, Austin, TX (US); David Hendrix, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 2 days.

(21) Appl. No.: 09/780,178

(22) Filed: Feb. 9, 2001

(51) Int. Cl.[7] .............................................. H01L 21/66
(52) U.S. Cl. .......................................... 438/14; 438/17
(58) Field of Search ..................... 438/14, 17; 364/489; 250/572, 492, 692; 385/129; 430/5, 6; 356/394

(56) References Cited

U.S. PATENT DOCUMENTS

| | | | | |
|---|---|---|---|---|
| 5,032,734 A | * | 7/1991 | Orazio, Jr. et al. | 250/572 |
| 5,112,448 A | * | 5/1992 | Chakravorty | 205/118 |
| 5,287,290 A | * | 2/1994 | Tabara et al. | 364/489 |
| 5,519,802 A | * | 5/1996 | Field et al. | 385/129 |
| 5,721,074 A | * | 2/1998 | Bae | 430/5 |
| 5,861,632 A | * | 1/1999 | Rohner | 250/492.21 |
| 6,067,163 A | * | 5/2000 | Guldi et al. | 356/394 |
| 6,093,243 A | * | 7/2000 | Okada et al. | 117/8 |
| 6,174,632 B1 | * | 1/2001 | Pike | 430/30 |
| 6,294,397 B1 | * | 9/2001 | Jarvis et al. | 438/17 |
| 6,335,129 B1 | * | 1/2002 | Asano et al. | 430/5 |
| 6,335,534 B1 | * | 1/2002 | Suguiro et al. | 250/492.21 |

OTHER PUBLICATIONS

Stanley Wolf and Richard N. Tauber; Silicon Processing for the VLSI Era, vol. 1: Process Technology; pp. 295–308, 320–321; 1986.

* cited by examiner

Primary Examiner—David Nelms
Assistant Examiner—Thinh T. Nguyen
(74) Attorney, Agent, or Firm—Timothy M. Honeycutt (57) ABSTRACT

Various methods and apparatus are provided for testing an ion implantation tool. In one aspect, a method of testing an ion implanter is provided that includes forming a mask with a preselected pattern on a substrate. An ion implant is performed on the mask with the ion implanter. Following the ion implant, a scan of the mask is performed to identify any defects thereon. Defects appearing on the mask following the implant are indicative of latent mechanisms at work within the implanter. Ion implanter induced defects may be economically analyzed.

37 Claims, 5 Drawing Sheets

METHOD AND APPARATUS FOR DETECTING ION IMPLANT INDUCED DEFECTS

BACKGROUND OF THE INVENTION

1. Field of the Invention

This invention relates generally to semiconductor processing, and more particularly to methods and apparatus for testing ion implantation tools for defect mechanisms.

2. Description of the Related Art

The advent of ion implantation marked a major milestone in semiconductor fabrication. Unlike diffusion processes that entail limited control over impurity region geometry and significant consumption of thermal budget, ion implantation promised and delivered the capability of precise geometric positioning of impurity regions with much shallower junctions and without excessive consumption of thermal budget through lengthy anneals. For these reasons, ion implantation has supplanted diffusion in many aspects of impurity region formation in semiconductor processing.

Ion implantation, as the name implies, involves the bombardment of a wafer or substrate surface with a beam of energetic charged atoms or molecules. In currently available ion implanters, the ion beam is formed from a feed source, either a gas or a solid, and accelerated through an acceleration tube. Before striking the target, the ion beam passes through various focusing and scanning apertures. In order to reduce the possibility of charge build up in the implanted surface, a neutralizing beam of electrons is directed into the outgoing ion beam prior to impact with the target surface. The neutralizing beam deionizes a significant quantity of the ions in the ion beam.

Various types of ion implantation processes may be performed at different stages in a given process flow for a semiconductor device. In many cases, the semiconductor wafer undergoes a cleansing bath in which the wafer is subjected to high frequency acoustic pulses. These so-called megasonic baths are designed to liberate contaminants and other unwanted debris left over from the ion implantation and perhaps earlier process steps. A variety of defects have been observed in the circuit structures of semiconductor wafers following megasonic bath cleansing. One type of defect that has been observed some frequency is a missing section or sections of a polysilicon line. Microscopic inspection of such defect sites has revealed that the missing sections are literally torn away from the remaining portions of the polysilicon line. The frequency of such defects has increased as the minimum device geometry or critical dimension of such circuit structures has decreased with improvements in lithography. This at least suggests structural damage due to kinetic collisions as a possible cause for the missing polyline defects.

Latent interactions occurring inside ion implantation tools are suspected as one possible source of the missing polysilicon line defects observed following megasonic bath cleansing. Moving this belief beyond technical suspicion has proved to be difficult. The primary reason is that troubleshooting an ion implantation tool is not a straightforward process. While in operation, ion implantation tools involve a complex interplay of a number of different electric and magnetic fields as well as high velocity spinning parts and particle collisions. The interplay between the various electromagnetic fields, rotating parts and particles within, and the beam geometry, current and energy settings of conventional ion implanters is not well understood.

Conventional methods for investigating the impact of ion implanter settings on wafer defects involve testing the relationship between tool settings and conditions between defects observed on actual product wafers or on bare silicon wafers. In the former case, actual product wafers are pulled from production and used for the diagnostic. This procedure, of course, requires the scrapping of otherwise useable wafers and therefore involves significant loss of potential revenue. The second technique involving the use of bare silicon as a test structure, while less costly than the aforementioned technique, nevertheless may not exhibit sufficient sensitivity to determine causation of suspected ion implantation induced structural defects. If the suspected ion implantation induced structural defects are dependent upon the topography of the implanted structures, then bare silicon test wafers will not adequately reproduce the conditions faced by actual product wafers.

The present invention is directed to overcoming or reducing the effects of one or more of the foregoing disadvantages.

SUMMARY OF THE INVENTION

In accordance with one aspect of the present invention, a method of testing an ion implanter is provided that includes forming a mask with a preselected pattern on a substrate and performing a first scan of the mask to identify any defects thereon. An ion implant is performed on the mask with the ion implanter. Following the ion implant, a second scan of the mask is performed to identify any defects thereon. The first and second scans are compared to identify any defects appearing on the mask following the ion implant.

In accordance with another aspect of the present invention, a method of testing an ion implanter is provided that includes forming a mask with a preselected pattern on a substrate such that the preselected pattern mimics a pattern of circuit structures to be formed in an integrated circuit. A first scan of the mask is performed to identify any defects thereon. An ion implant is performed on the mask with the ion implanter with the ion implanter being set to implant at conditions corresponding to implant conditions to be used in implanting a region of the integrated circuit including the circuit structures. Following the ion implant, a second scan of the mask is performed to identify any defects thereon and the first and second scans are compared to identify any defects appearing on the mask following the ion implant.

In accordance with another aspect of the present invention, an apparatus is provided that includes a substrate and a mask positioned on the substrate that has a pattern of upwardly projecting members. The members have a base and an upper surface. The base is smaller in cross-section than the upper surface whereby the members are mechanically weaker at their bases than at their upper surfaces.

In accordance with another aspect of the present invention, an apparatus is provided that includes a substrate and a mask of insulating material positioned on the substrate. The mask has a preselected pattern mimicking a pattern of circuit structures to be formed in an integrated circuit.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
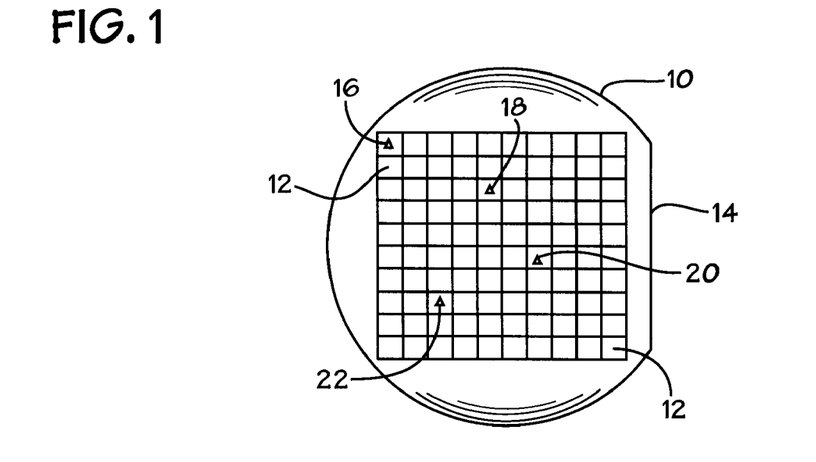
FIG. 1 is a plan view of a semiconductor wafer or substrate in accordance with the present invention.

In the drawings described below, reference numerals are generally repeated where identical elements appear in more than one figure. FIG. 1 depicts a plan view of a semiconductor wafer or substrate 10 upon which a plurality of integrated circuits 12 are fabricated. The wafer 10 is provided with one or more flats 14 or notch(es) (not shown) that facilitate the spatial orientation of the wafer 10 in various semiconductor processing tools. The integrated circuits 12 are delineated into a plurality of die that may be configured to implement any of a variety of electronic functions. Examples include memory circuits, microprocessors, analog-to-digital converters and digital-to-analog converters to name just a few. The wafer 10 may be composed of silicon, silicon-on-insulator, or other well known substrate materials.

Figure 2:
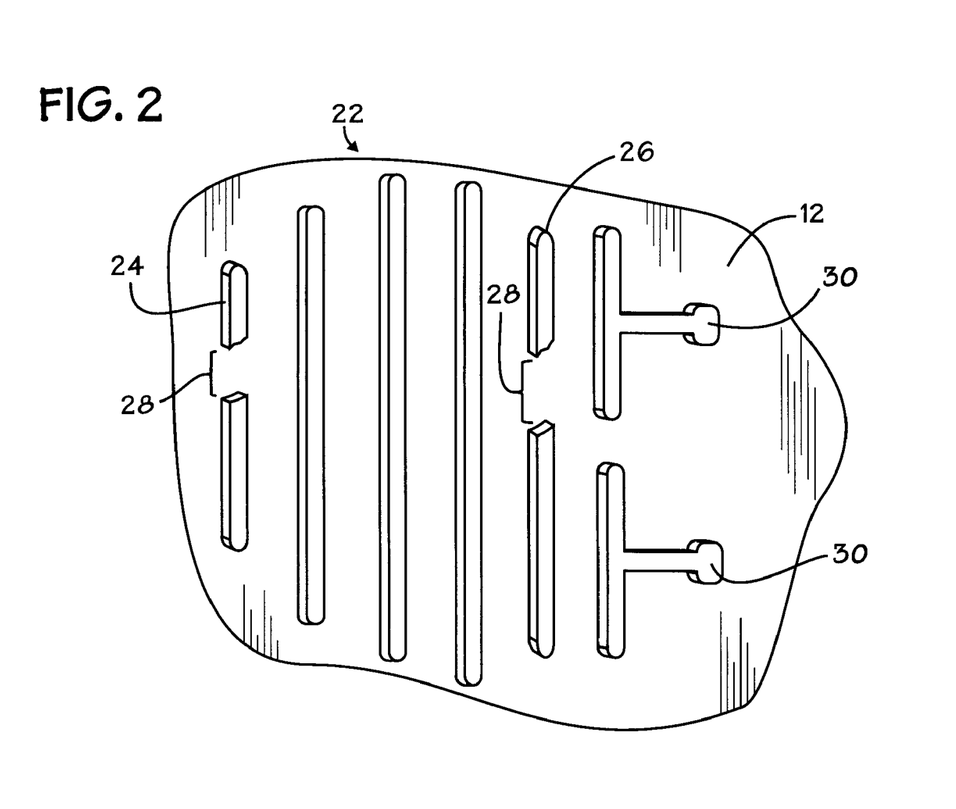
FIG. 2 is a magnified view of a small portion of FIG. 1 in accordance with the present invention.

The substrate 10 is shown in FIG. 1 following etch definition of a plurality of circuit structures and defect inspection. The inspection has revealed the presence of various defects, four of which are shown and labeled, respectively, 16, 18, 20 and 22. A small portion of the integrated circuit 12 encompassing the defect 22 is depicted in FIG. 2. As shown in FIG. 2, the integrated circuit 12 includes a plurality of circuit structures. The circuit structures 24 and 26 consist of conductor lines that exhibit a type of structural defect commonly observed following etch definition, ion implantation and megasonic cleaning. The defects consist of damaged or otherwise missing sections 28 of the lines 24 and 26. Similar defects may be observed in insulator structures as well.

The defects 28 have been observed in the circuit structures 24 and 26 of the integrated circuit 12, both before and after megasonic cleaning. However, the number of the defects 28 tends to be markedly higher following megasonic cleaning. Manufacturing experience has demonstrated that the defects 28 tend to appear more frequently, although not exclusively, in relatively long uninterrupted circuit structures, such as the structures 24 and 26. Circuit structures, such as the T-gate structures 30 shown in FIG. 2, have demonstrated fewer occurrences of post-implant and megasonic bath structural failure than those types of circuit structures that do not have intersecting components and/or irregular structural shapes.

Figure 3:
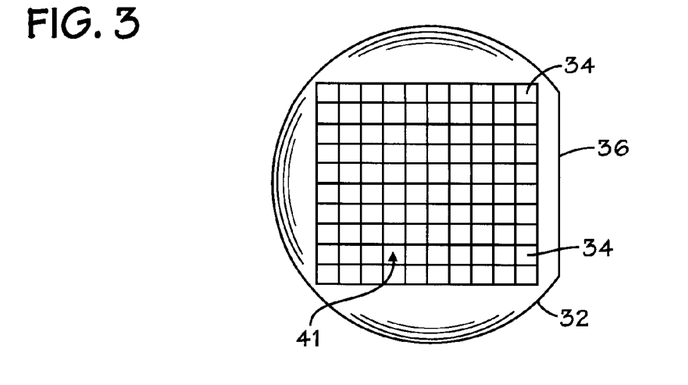
FIG. 3 is a plan view of an exemplary embodiment of a test apparatus in accordance with the present invention.

The defects 28 are thought to be the result of unanticipated interactions in ion implanters during ion implantation of the integrated circuits 12. In an attempt to track down causation, a novel approach to testing an ion implanter is envisioned. An exemplary method and apparatus in accordance with the present invention may be understood by referring now to FIGS. 3, 4 and 5. A substrate 32 may be provided with one or more die locations 34, and one or more flats 36 or notch(es) (not shown) to facilitate spatial orientation in various processing tools. A mask 38 that has a preselected pattern of structures 40 may be fabricated on one or more of the die locations 34. An exemplary defect 41 on substrate 32 is shown in FIG. 3 and will be described below.

Figure 4:
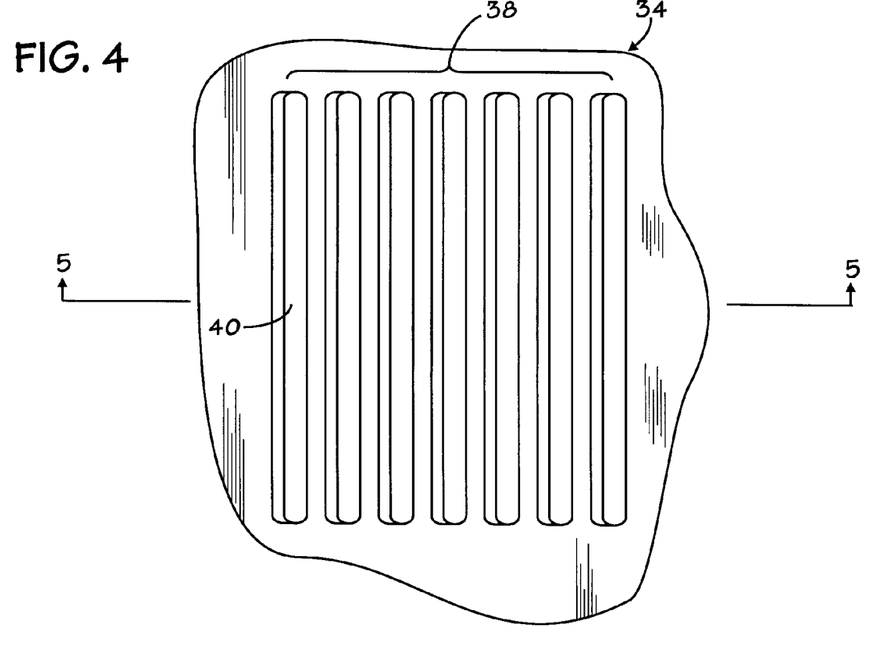
FIG. 4 is a magnified view of a small portion of FIG. 3 in accordance with the present invention.
Figure 5:
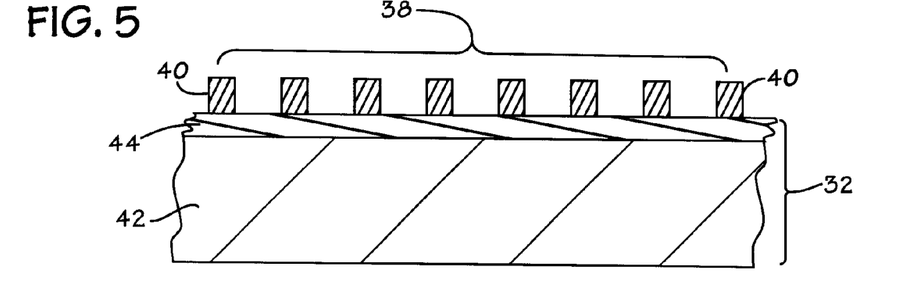
FIG. 5 is a cross-sectional view of FIG. 4 taken at section 5—5 in accordance with the present invention.

In the embodiment illustrated in FIGS. 4 and 5, the mask 38 consists of a plurality of parallel structures or lines 40 that advantageously mimic the structural topography of, for example, high aspect ratio conductor lines commonly used in commercial integrated circuits. However, the skilled artisan should appreciate that the mask 38 may be patterned in any of a virtually infinite variety of shapes while still achieving the benefits of the present invention. Each of the die locations 34 may be provided with an identical mask 38 or different types of masks may be provided at various die locations 34 as desired.

As best seen in FIG. 5, the substrate 32 may consist of a semiconductor substrate 42 upon which a dielectric film 44, made of, for example, oxide, nitride, or laminates of these is disposed. Although the substrate 32 may be fabricated in any of a great variety of geometries, the substrate 32 may be advantageously fashioned from commercially available wafers that are used for commercial device fabrication.

Figure 6:
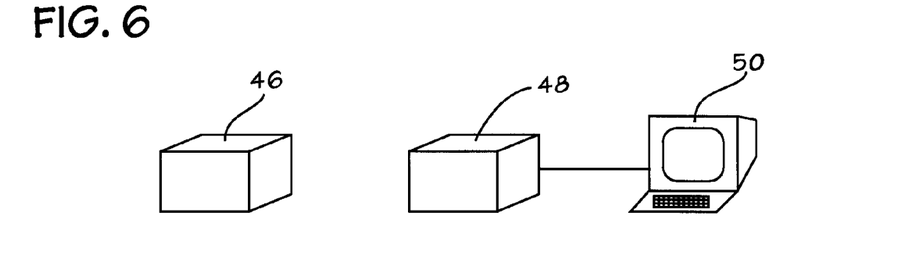
FIG. 6 is a schematic view of an ion implanter and a metrology tool in accordance with the present invention.

The substrate 32 is designed to be placed in an ion implantation tool 46 shown in FIG. 6 and subjected to one or more ion implantation steps. Preferably, the ion implantation steps will be conducted using the same energy, dosage and implant angle implant parameters as used to fabricate circuit structures on a commercial part. In this regard, the implants may be performed using, for example, the same energy, beam current, neutralization current, dosage, impurity specie and implant angle. In this way, the conditions imposed upon the substrate 32 by the implantation tool 46 will closely track those faced by commercial parts.

The mask 38 is advantageously composed of materials that exhibit rigidity and brittleness. These physical properties heighten the probability that the mask structure 38 will exhibit observable structural failure as a result of impacts by massive particles and electrostatic discharge during the ion implantation step. Exemplary materials include, for example, photoresist, polyimide, oxide, polysilicon or the like. Laminate structures are envisioned, such as a stack of polysilicon on oxide. In one exemplary embodiment, the mask 38 is composed of I-line photoresist. The mask 38 may be applied to a thickness of about 0.3 to 0.6 $\mu$m and the individual structures 40 may be patterned with an aspect ratio of about 2:1 to about 5:1. The skilled artisan will appreciate that the size parameters of the mask 38 are subject to design discretion. If composed of photoresist, well-known resist exposure and bake processes may be employed to fabricate the mask 38.

In order to isolate those surface defects in circuit structures likely caused by latent mechanisms occurring within the ion implanter 46, it may be desirable to determine the pre-implantation state of the substrate 32. Accordingly, the substrate 32 and the mask 38 undergo a pre-implant metrology scan in a metrology tool 48 shown in FIG. 6. The metrology tool 48 may be any of a variety of different types of metrology tools, including commercially available models, such as, for example, a KLA-Tencor AIT laser scanner, a KLA-Tencor 21 XX optical scanner, an Orbot WF laser scanner, or the like, to name just a few. Manual optical scanning may also be used as desired. Indeed, multiple metrology scans in different types of scanners may be used if desired. The metrology tool 48 is provided with a computer system 50 that provides control and data analysis functions. Most commercially available metrology tools include such a computer system for control and data analysis.

An exemplary pre-implant condition for the substrate is depicted in FIG. 3. The results of the scan in the metrology tool 46 indicate the presence of a single exemplary defect 41 on one of the die locations 34. The pre-implant defect(s) 41 may be characterized according to size and type. For example, the defect(s) 41 may be categorized as a surface particle, a missing portion of the mask pattern 38, a surface flake, or other type of defect. These categories represent just a few of the myriad of possible defect categories that may be used.

Following the pre-implant scan, the substrate 32 is placed in the implanter 46 and subjected to one or more ion implantation steps, preferably using the implanter settings energy specified for a particular implant in a commercial product process flow. As noted above, the goal of the implantation step on the substrate 32 is to mimic the conditions that would exist if the substrate 32 were a commercial part undergoing device ion implantation. In an exemplary embodiment, the implantation step is designed to mimic a source/drain impurity implant using arsenic as the impurity specie. The energy may be about 20 KeV and the dosage may be about 4.5E15 ions/cm$^2$. The implant angle may be 0° and the arsenic may be singly charged. For an implant performed in a Varian Vision 80 implanter, the ion beam current may be about 7 to 9 milliamps and the flood current may be about 3 amps arc current and about 2 sccm xenon gas flow. A slightly higher beam current may be appropriate in, for example, an Applied Materials implantation tool. The implant parameters are subject to design discretion.

Figure 7:
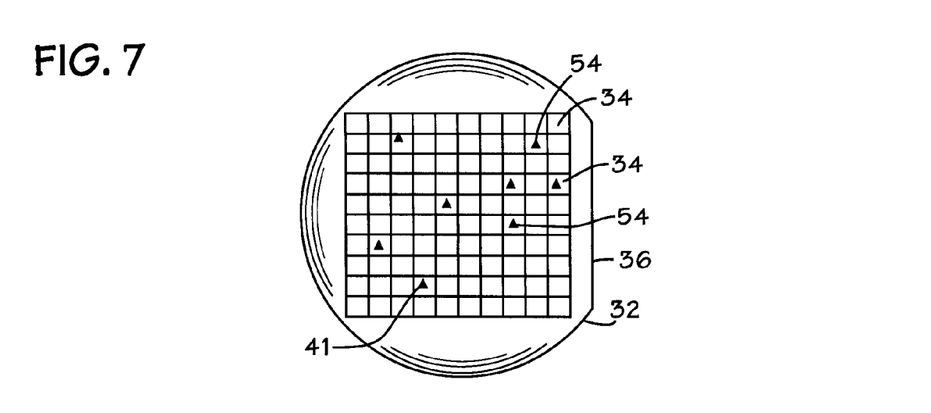
FIG. 7 is a plan view of the test apparatus of FIG. 3 following ion implantation and defect scanning in accordance with the present invention.

A hypothetical post-implant state of the substrate 32 is depicted in FIG. 7. Following the implantation, the substrate 32 and the mask are again scanned in the metrology tool 48. The scan reveals the presence of additional defects 54 located at various die locations 34 on the substrate 32. Note that the post-implant scan of the substrate 32 may be performed before or after a megasonic bath cleaning step. A scan performed prior to megasonic bathing will reveal those defects produced by a structural failure during ion implantation, whereas a scan performed following megasonic bathing will reveal not only those defects associated with a catastrophic structural failure during implant, but also those associated with structural weakening of various circuit structures during ion implant followed by failure during megasonic cleaning.

Figure 8:
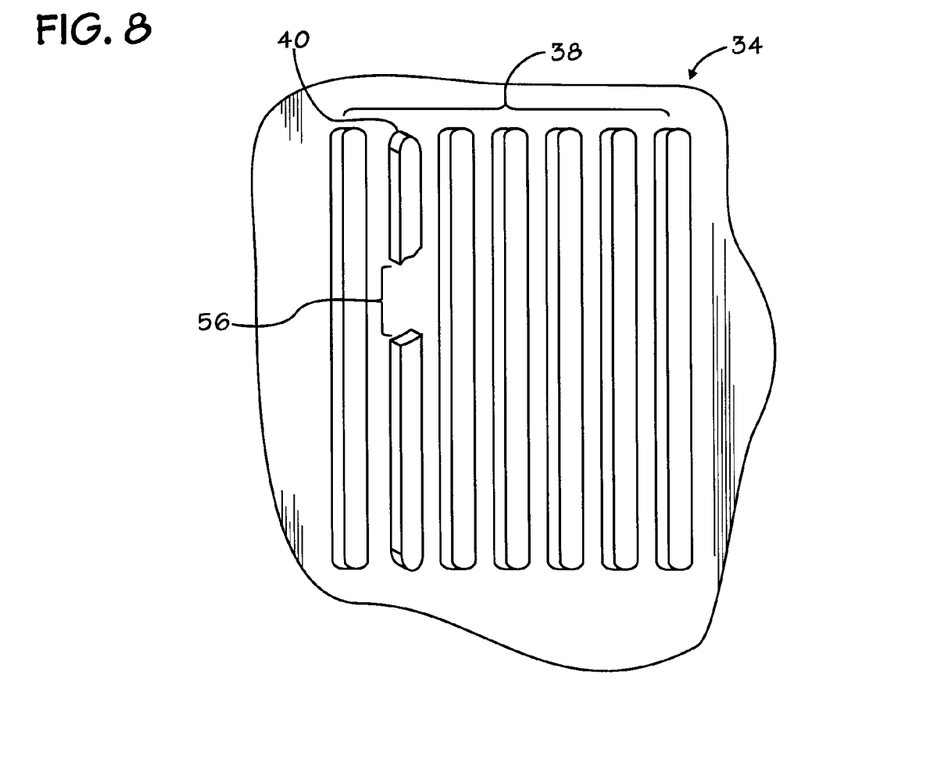
FIG. 8 is a magnified view of a small portion of FIG. 7 in accordance with the present invention.

A magnified view of one of the defect locations 54 is depicted in FIG. 8. The structure 40 of the mask 38 has experienced a structural failure resulting in the missing portion defect 56. The location of the post-implant defect 54 and the other defects may be determined by the computer system 50 using well-known defect source analysis techniques. In this method, the pre-implant defects are subtracted out of a post-implant digital image of the substrate 32. Once located, the post-implant defects 54 may then be analyzed and characterized.

The substrate 32 in accordance with the present invention may, thus, be used to test the implanter 46 as a potential cause for structural defects. The substrate 32 may be implanted at various energy, dosage, implant angle, beam and flood current settings for the implanter and those various combinations of settings may be correlated to defects produced in the masks 38 of the substrate 32. Since the implanter diagnostics may be performed on relatively inexpensive test substrates, circuit defects due to implanter malfunction or contamination may be rooted out at much lower expense.

Two potential causes for ion implanter induced structural defects are thought to be the result of massive particle impacts and electrostatic discharge. Many current ion implanters utilize a relatively large disk that spins at high enough rpms to produce velocities of 200 mph or greater at the outer extremities thereof. It is suspected that such physical extremes may result in the ejection and/or circulation of massive particles that are unintentionally impacted into the surface of semiconductor wafers. Electrostatic discharge is also thought to produce some of the structural defects observed immediately after ion implantation. Both massive particle impacts and electrostatic discharge are thought to at least potentially result from interactions created by automatic tuning and profiling of the ion implantation beam. These automatic tuning and profile adjustment steps are currently carried out just prior to implantation of a given lot of semiconductor wafers. The investigation of the impact of the automatic tuning and profile adjustment for ion beam on the frequency of structural defects in post-implant may be readily investigated using the substrate 32 in accordance with the present invention.

Figure 9:
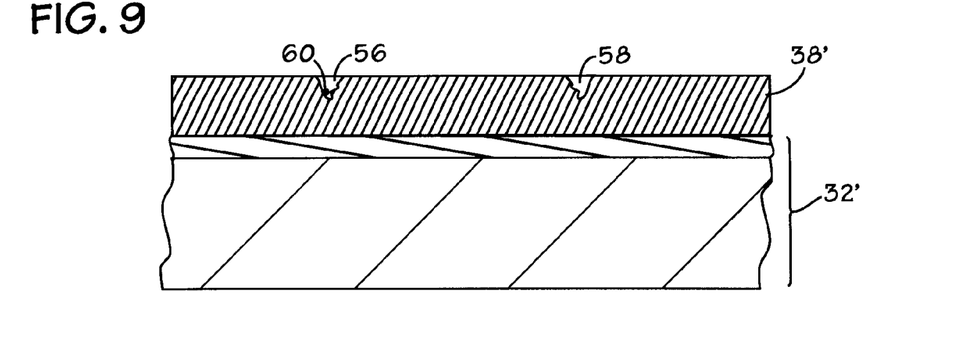
FIG. 9 is a cross-sectional view like FIG. 5 of an alternate exemplary embodiment of the test apparatus in accordance the present invention.

In order to fully investigate the causes of ion implanter induced structural defects in circuit structures, it will be helpful to analyze the composition of massive particles striking a wafer during ion implantation. Experiment has shown that such massive particles tend to exhibit partially inelastic collisions with circuit structures. Such collisions result in structural failure in circuit structures. However, the collisions tend to be elastic enough so that the suspected massive particles bounce off and remain latent in subsequent metrology scanning. In accordance with another aspect of the present invention, a substrate, now designated 38' and shown in cross-section in FIG. 9, may be fabricated with an overlying mask structure, now designated 38', that consists of a relatively planar sheet. The mask 38' may be composed of the same types of materials used to fabricate the mask 38 depicted above, although softer materials, such as various organic-based glasses, may yield more inelastic collisions and more observable damage than harder materials. In this embodiment, the pre-selected pattern of the mask 38 constitutes a blanket film. The sheet-like construction of the mask 38' provides a large and relatively compliant surface area which can be used to identify impact craters 58 and 60 caused by impacts with massive particles thrown out during the ion implantation process. It is anticipated that a sheet-like mask structure 38' will heighten the chances that a given impact crater, such as the crater 56, will trap a massive particle 60 as shown. The particle 60 may then be excised, cross-sectioned and examined for composition. In this way, a more precise origin of massive particle impacts may be readily determined.

Figure 10:
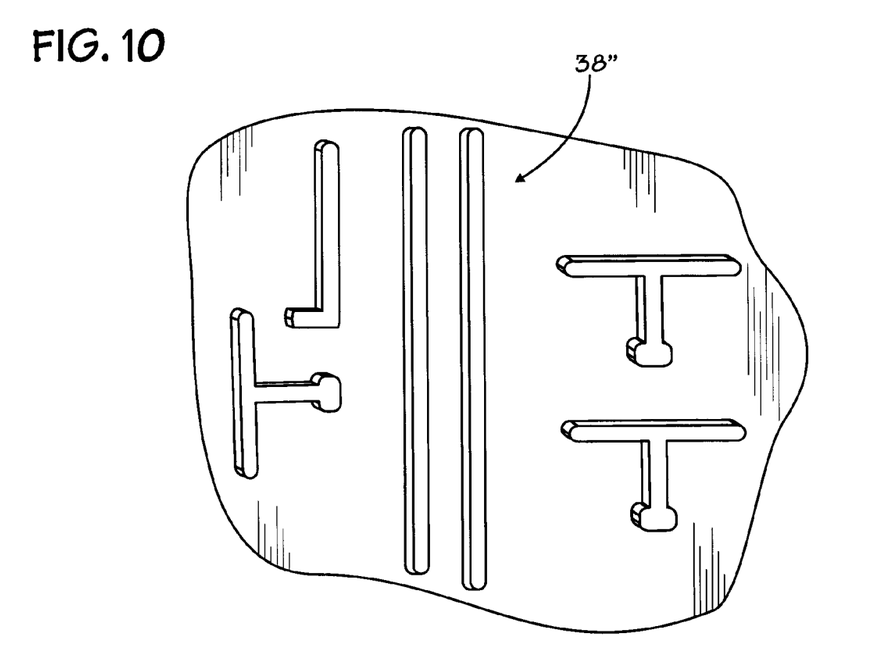
FIG. 10 is a plan view like FIG. 4 of another alternate exemplary embodiment of the test apparatus in accordance the present invention.

As noted above, the embodiment of the mask 38 shown in FIGS. 4 and 5 represents just one possible configuration. Indeed, the mask 38 may be patterned to mimic the pattern of virtually any circuit structure. FIG. 10 is a plan of an alternate embodiment of the mask, now designated 38", and illustrates just one other possible arrangement.

Figure 11:
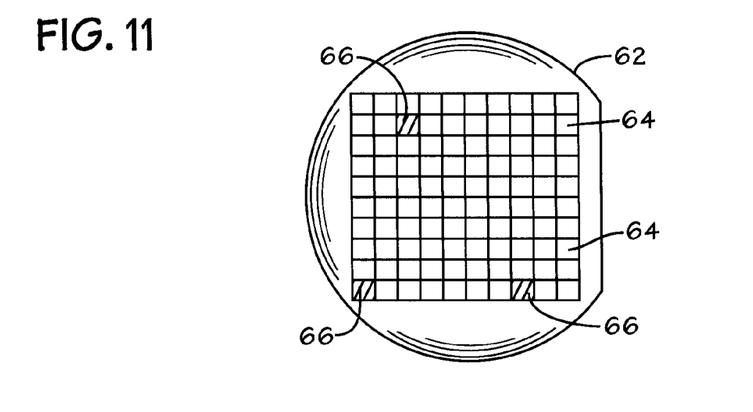
FIG. 11 is a plan view like FIG. 3 of another alternate exemplary embodiment of the test apparatus in accordance the present invention.

In the embodiment described above, the mask 38 is implemented on a substrate 32 dedicated to testing. However, the skilled artisan will appreciate that the mask 38 may be incorporated into commercial wafers or substrates. For example, and as shown in FIG. 11, a substrate 62 may be patterned with a plurality of active device die sites 64 and one or more test sites 66. The active device die sites may be provided with one or more integrated circuits. The mask 38 (not visible) may be patterned on the test sites 66 and used to troubleshoot an ion implanter. In this way, only a portion of a commercial wafer need be sacrificed for testing.

Figure 12:
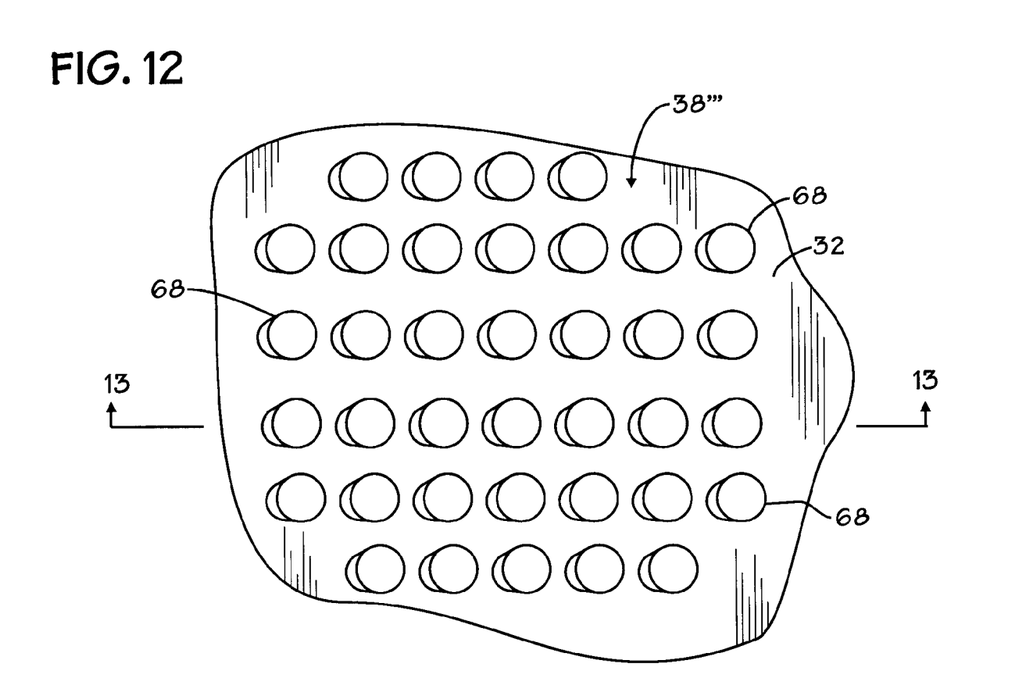
FIG. 12 is a plan view like FIG. 4 of another alternate exemplary embodiment of the test apparatus in accordance the present invention.
Figure 13:
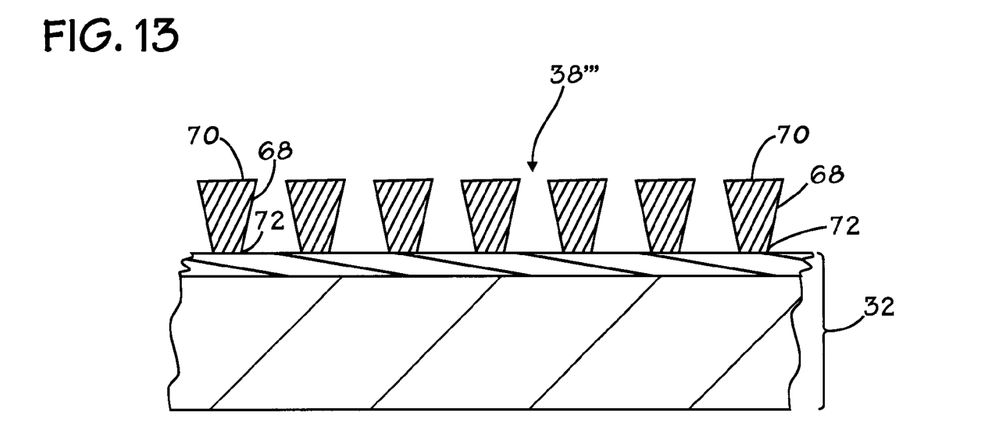
FIG. 13 is a cross-sectional view of FIG. 12 taken at section 13—13 in accordance with the present invention.

In another alternate embodiment depicted in FIGS. 12 and 13, the mask, now designated 38''', is implemented on a substrate 32 with a pre-selected pattern that consists of a plurality of upwardly projecting members or posts 68. FIG. 12 is a plan view and FIG. 13 is a cross-sectional view of FIG. 12 taken at section 13—13. As best seen in FIG. 13, the members 68 are formed with a retrograde, that is, an inwardly sloping profile. This retrograde profile serves two important functions. First, the relatively large upwardly facing surfaces 70 of the members 68 furnish a rich target surface for particle impacts during diagnostic ion implantation. Second, the small cross-sections of the bases 72 of the members 68 translate into diminished mechanical strength. This heightens the chances that a given particle impact will cause a failure in one or more of the members 68 that may be readily observed in post-implant scanning. Other than cylindrical shapes are envisioned for the members 68.

The mask 38''' and the substrate 32 may be fabricated from the same types of materials as the other embodiments described above. If composed of resist, the members 68 may be formed with the retrograde profile by intentionally defocusing the exposure radiation during resist exposure. If composed of other than resist, the retrograde profile may be provided by well-known directional etching techniques in which pressure and chemistry are manipulated during etch to provide a tapering profile. Implanter diagnostics may be performed with the mask 38''' and substrate 32 using the same techniques described above.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of testing an ion implanter, comprising:
   forming a mask with a preselected pattern on a substrate;
   performing an ion implant on the mask with the ion implanter; and
   following the ion implant, performing a first scan of the mask to identify any defects thereon.

2. The method of claim 1, comprising performing a second scan of the mask prior to performing the ion implant to identify any defects thereon existing prior to the ion implant, and comparing the first and second scans to identify any defects appearing on the mask following the ion implant.

3. The method of claim 1, wherein the mask comprises photoresist.

4. The method of claim 1, wherein the mask comprises oxide.

5. The method of claim 1, wherein the mask comprises a plurality of parallel lines.

6. The method of claim 1, wherein the substrate comprises an oxide film positioned on a silicon substrate.

7. The method of claim 1, wherein the first scan is performed with a metrology tool.

8. The method of claim 7, wherein the first scan comprises characterizing any defects found according to defect type.

9. The method of claim 1, wherein the ion implant comprises implanting with a p-type or a n-type impurity species.

10. The method of claim 2, wherein the second scan is performed with a metrology tool.

11. The method of claim 10, wherein the second scan comprises characterizing any defects found according to defect type.

12. The method of claim 2, wherein the comparing of the first and second scans to identify any defects appearing on the mask following the ion implantation comprises defect source analysis.

13. A method of testing an ion implanter, comprising:
   forming a mask with a pre-selected pattern on a substrate, the preselected pattern mimicking a pattern of circuit structures to be formed in an integrated circuit;
   performing a first scan of the mask to identify any defects thereon;
   performing an ion implant on the mask with the ion implanter, the ion implanter being set to implant at conditions corresponding to implant conditions to be used in implanting a region of the integrated circuit including the circuit structures;
   following the ion implant, performing a second scan of the mask to identify any defects thereon; and
   comparing the first and second scans to identify any defects appearing on the mask following the ion implant.

14. The method of claim 13, wherein the mask comprises photoresist.

15. The method of claim 13, wherein the mask comprises oxide.

16. The method of claim 13, wherein the mask comprises a plurality of parallel lines.

17. The method of claim 13, wherein the substrate comprises an oxide film positioned on a silicon substrate.

18. The method of claim 13, wherein the first scan is performed with a metrology tool.

19. The method of claim 18, wherein the first scan comprises characterizing any defects found according to defect type.

20. The method of claim 13, wherein the ion implant comprises implanting with a p-type or a n-type impurity species.

21. The method of claim 13, wherein the second scan is performed with a metrology tool.

22. The method of claim 21, wherein the second scan comprises characterizing any defects found according to defect type.

23. The method of claim 13, wherein the comparing of the first and second scans to identify any defects appearing on the mask following the ion implantation comprises defect source analysis.

24. An apparatus, comprising:
   a substrate; and
   a mask positioned on the substrate and having a pattern of upwardly projecting members, the members having a base and an upper surface, the base being smaller in cross-section than the upper surface whereby the members are mechanically weaker at their bases than at their upper surfaces.

25. The apparatus of claim 24, wherein the members comprise posts.

26. The apparatus of claim 25, wherein the posts are cylindrical.

27. The apparatus of claim 24, comprising an integrated circuit positioned on the substrate.

28. The apparatus of claim 24, wherein the mask comprises photoresist.

29. The apparatus of claim 24, wherein the mask comprises oxide.

30. An apparatus, comprising:
   a substrate; and
   a mask of insulating material positioned on the substrate, the mask having a preselected pattern mimicking a pattern of circuit structures to be formed in an integrated circuit.

31. The apparatus of claim 30, wherein the integrated circuit is positioned on the substrate.

32. The apparatus of claim 30, wherein the integrated circuit is not positioned on the substrate.

33. The apparatus of claim 30, wherein the mask comprises photoresist.

34. The apparatus of claim 30, wherein the mask comprises oxide.

35. The apparatus of claim 30, wherein the mask comprises a laminate of polysilicon and oxide.

36. The apparatus of claim 30, wherein the pre-selected pattern comprises a plurality of parallel lines.

37. The apparatus of claim 30, wherein the substrate comprises an oxide film positioned on a silicon substrate.

* * * * *